United States Patent [19]

Austin

[11] 3,805,213

[45] Apr. 16, 1974

[54] FLEXIBLE CIRCUIT CONNECTORS

[75] Inventor: James E. D. Austin, Southbridge, Mass.

[73] Assignee: Data General Corporation, Southboro, Mass.

[22] Filed: Mar. 22, 1972

[21] Appl. No.: 236,867

[52] U.S. Cl. ................ 339/17 F, 174/117, 317/101

[51] Int. Cl. ................ H05k 1/00

[58] Field of Search ........ 339/17, 18, 176; 174/117; 317/101 F, 101 CC

[56] References Cited

UNITED STATES PATENTS

| | | | |
|---|---|---|---|
| 3,248,779 | 5/1966 | Yuska et al. | 317/101 CC X |
| 3,633,189 | 1/1972 | Billawala | 339/17 F X |
| 2,703,854 | 3/1955 | Eisler | 339/17 F X |
| 2,997,521 | 8/1961 | Dahlgren | 174/117 PC |
| 3,069,753 | 12/1962 | Lalmond et al. | 339/17 F X |
| 3,605,060 | 9/1971 | Praeger et al. | 339/17 F |
| 2,634,310 | 4/1953 | Eisler | 339/17 F |

*Primary Examiner*—Marvin A. Champion
*Assistant Examiner*—Terrell P. Lewis
*Attorney, Agent, or Firm*—Dike, Bronstein, Roberts & Cushman

[57] ABSTRACT

A flexible circuit edge connector in which two sets of connector elements in a flexible circuit member are bonded to opposite sides of an edge of a rigid member so as to be independently connectible to circuit leads on the same side of the flexible circuit member.

6 Claims, 6 Drawing Figures

FLEXIBLE CIRCUIT CONNECTORS

This invention relates generally to connectors for electrical circuits and, more particularly, to connectors for use with flexible circuit materials.

BACKGROUND OF THE INVENTION

For many applications it is desirable to use circuit structure commonly referred to as flexible circuits, in which circuit leads are encased in layers of flexible plastic dielectric material. In such flexible circuitry a certain number of circuit leads must be connected to power sources, or other circuits or devices, for example, which are external to the flexible circuitry via cables or other means. In many applications such connections are made through appropriate pin connector members having either horizontal or circular pin configuration. In other applications, however, it is desirable or necessary to make the external connections through a planar connector member commonly referred to as an edge connector.

In using edge connectors with flexible circuit material the circuit leads requiring external connections are terminated in a plurality of parallel spaced gold-plated fingers which serve as the connector elements. The connector region of the flexible circuit is backed with a rigid material to form a single-sided printed circuit edge connector member which can be engaged by an external edge connector member having corresponding connector elements for making appropriate contact with the flexible circuit connector elements. If a large number of external connections are required, the rigid edge connector region of the flexible circuit becomes relatively long and, in some applications, it may be sufficiently long as to be unfeasible for use because of the spatial limitations that are so imposed.

Hence, it is desirable in some cases that the length of the edge connector region of a flexible circuit be arranged to be as short as possible while at the same time making a sufficient number of connector elements available for external connections to the circuit.

DISCLOSURE OF THE INVENTION

In accordance with the invention the length of the connector member is shortened considerably if the flexible circuit connector elements are so arranged that they can be disposed on opposite sides of a stiffener member so that a double-sided edge connector may be used to engage the flexible circuit connector region; it being possible thereby to reduce the length of the overall connector region to approximately one-half its previous size. In a preferred embodiment of the invention the connector elements of the flexible circuit are effectively arranged, for example, into two groups, each group connected to a corresponding group of circuit leads to which external connection is desired. The groups are positioned at two regions along an edge of the flexible circuit material, which regions are spaced from each other by a preselected distance. When the connector elements, and the circuit leads connected thereto, are formed in the flexible circuit, the two regions containing the two separately spaced groups of connector elements are then folded along a line intermediate the two regions so that the flexible circuit material in effect can then be folded over the stiffener member so that the first group of connector elements is located on one side of the stiffener member and the second group is correspondingly located on the opposite side thereof, in each case the connector elements being exposed for engagement with an external connector element. The non-exposed sides of the flexible circuit in the regions where the connector elements are located are then appropriately bonded to opposite sides of the stiffener member so that a firm and rigid, double-sided edge connector member is effectively formed. Accordingly, the overall length of the connector for the flexible circuit is effectively reduced in half.

The invention may be described in more detail with reference to the attached drawings wherein.

Figure 1:
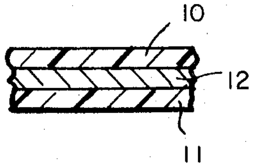
FIG. 1 shows a view in cross-section of a portion of a flexible circuit of the type used in connection with the invention.
Figure 2:
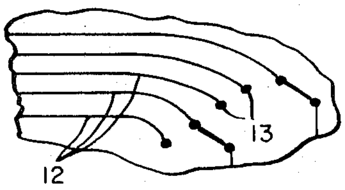
FIG. 2 shows a plan view of a portion of such flexible circuit having an exemplary circuit lead layout.

FIG. 1 depicts an enlarged, cross-sectional view of a portion of a flexible circuit material containing circuit leads, which view is used to illustrate the general construction thereof, as is known in the art. As can be seen therein, the circuit includes an upper layer 10 and a lower layer 11 of an appropriate flexible material, such as a suitable thermoplastic material. One such material that has been successfully used, particularly in applications where operation in a relatively high temperature range is expected and where durability is especially desired, is identified in the art by the designation "Kapton." As shown in FIG. 1, the plastic layers encase a circuit lead 12. Usually the circuitry is fabricated by forming a layer of conductive material, such as copper, on a layer of the flexible plastic material and then etching the copper so as to form one or more circuit leads thereon. A second layer of flexible material is then bonded to the first layer above the circuit leads to form the overall flexible circuit. FIG. 2 shows a plan view of a portion of such a flexible circuit in which a plurality of circuit leads 12 have been so encased between two layers thereof.

The flexible material is generally transparent or translucent so that the leads can be readily seen through the layers thereof. The material can be pierced at appropriate points of the circuit and solder terminals 13 connected to the leads at such points so that circuit elements can be connected thereto on the exterior surfaces of the flexible circuit material where desired. The method of forming such leads in a flexible circuit is well known to those in the art and will not be further described in detail here.

Figure 3:
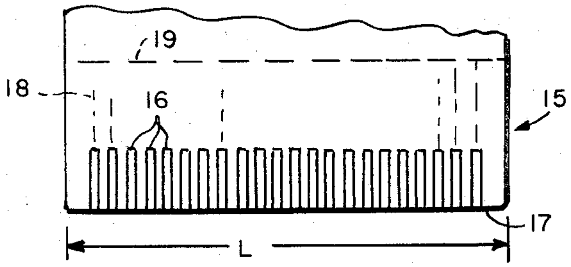
PRIOR ART FIG. 3
FIG. 3 shows a connector member as used in prior art flexible circuits.

In making external connections to the flexible circuit, as via a cable, for example, circuits of the prior art using edge connectors generally position a plurality of connector elements along one edge of the flexible circuit material, as shown in FIG. 3, wherein flexible circuit 15 has a plurality of connector elements 16 along one side 17 thereof. Connector elements 16 are formed, for example, as gold-plated copper strips, or fingers, which are connected to the ends of the circuit leads which are to be connected externally. The region where the connector elements are located is appropriately bonded to a stiffener member 18, one edge of which conforms to the edge of the flexible circuit. The overall dimensions of stiffener member are such as to provide a suitable one-sided edge connector element, as shown by dashed line 19. Thus, the overall connector region 19 is rigid and adaptable for engagement with a suitable one-sided cable edge connector into which the edge 17 can be inserted. As can be seen in FIG. 3, the length "L" of such connector depends on the number of connector elements 16 required in the specific embodiment being fabricated.

Figure 4:
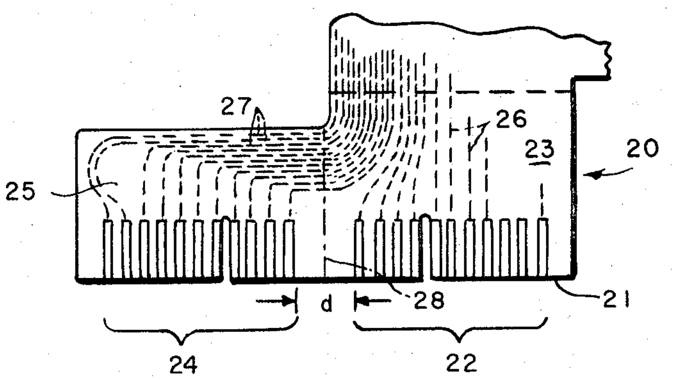
FIG. 4 shows the connector region of a flexible circuit in accordance with the invention prior to assembly in final form.
Figure 6:
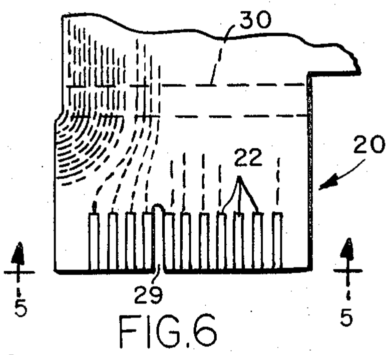
FIG. 6 shows a plan view of the connector region of FIG. 5.
Figure 5:
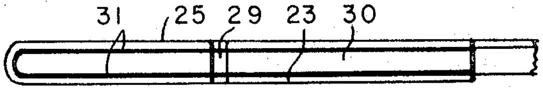
FIG. 5 shows an end view of the connector region of the invention following assembly thereof.

In order to reduce the length of the connector region, the connector structure of the invention, as shown in FIGS. 4 to 6, is used. As seen therein, a flexible circuit 20 is arranged so that a first plurality of connector elements 22 are disposed as a first group along one edge 21 thereof in a first region 23 while a second plurality of connector elements 24 are disposed as a second group in a second region 25 along the same edge. The first and second groups of connector elements are spaced from each other by a preselected distance *d* as shown. A first plurality of circuit leads 26 are arranged within the flexible circuit to be connected to the first plurality of connector elements 22 while a second plurality of circuit leads 27 are arranged to be connected to the second plurality of connector elements 24.

In forming the fully assembled edge connector structure of the flexible circuit of the invention, the flexible material is folded along the dashed line 28 so that region 25 can be folded under region 23 in a manner such that the connector elements 24 and 22, respectively, remain exposed on the oppositely disposed exterior surfaces thereof. The folded regions 23 and 25 are then placed on opposite sides of a stiffener member 30 in the form of a rigid board made, for example, of a suitable epoxy resin material. The interior, non-exposed surfaces of regions 23 and 25 are then appropriately bonded to the oppositely disposed flat sides of stiffener member 30 by any suitable adhesive material 31, such as an epoxide adhesive.

When the connector portion of the flexible circuit is so assembled, the length of the overall connector region, as shown in FIG. 6, is reduced effectively to about one-half of that shown in FIG. 3 for the same number of connector elements. The connector regions 23 and 25 are maintained in a rigid double-sided male edge connector form so that they can be connected to external circuitry via a suitable corresponding double-sided female edge connector member (not shown) into which the regions 23 and 25 are inserted along edge 21.

The connector can be appropriately keyed for use with the external connector member. One keying technique which has been found satisfactory is to form an indentation 29 at a selected location intermediate two connector elements. The indentation has a configuration which conforms to the outline of a corresponding projection on the external connector member so that the external connector can be correctly positioned to receive the rigid connector of the flexible circuit.

What is claimed is:

1. A flexible circuit edge connector comprising
a rigid member having oppositely disposed flat sides;
a flexible circuit member having circuit leads therein;
a first plurality of connector elements positioned at a first region of said flexible circuit member substantially along an edge thereof, said first plurality of connector elements being connected to a first plurality of said circuit leads of said flexible circuit member;
a second plurality of connector elements positioned at a second region of said flexible circuit member substantially along said edge thereof, said second plurality of connector elements being connected to a second plurality of said circuit leads on the same side of said flexible circuit member as said first plurality of said circuit leads; and

2. A flexible circuit edge connector in accordance with claim 1, wherein said first region is positioned at a preselected distance from said second region along said edge of said flexible circuit member.

3. A flexible circuit edge connector in accordance with claim 2, and further wherein said flexible circuit member is folded along a line intermediate said first and second regions to permit said regions to be bonded to said rigid member.

4. A flexible circuit edge connector in accordance with claim 3 and further including keying means formed in said rigid connector of said flexible circuit member for permitting said rigid member to be keyably engaged with said external connector member.

5. A flexible circuit edge connector in accordance with claim 4, wherein said keying means is in the form of an indentation formed in said rigid member and in said flexible circuit member between two connector elements of each of said first and said second plurality of said connector elements.

6. A method of fabricating flexible circuit edge connectors comprising the steps of
forming a first plurality of connector elements at a first region of a flexible circuit material along one edge thereof, said connector elements having a first plurality of circuit leads connected thereto;
forming a second plurality of connector elements at a second region of said flexible circuit material along said one edge, said connector elements having a second plurality of circuit leads connected thereto and being positioned at a preselected distance from said first plurality of connector elements;
folding said first and said second regions of said flexible circuit material along a line intermediate said first and said second regions thereof so that said first and said second plurality of connector elements are exposed for connection independently of each other on oppositely disposed exterior surfaces, respectively, of said flexible circuit material; and
bonding the interior, non-exposed surfaces of said first and said second regions to opposite sides of said rigid member.

* * * * *